(12) United States Patent
Krieger et al.

(10) Patent No.: US 7,154,769 B2
(45) Date of Patent: Dec. 26, 2006

(54) MEMORY DEVICE INCLUDING BARRIER LAYER FOR IMPROVED SWITCHING SPEED AND DATA RETENTION

(75) Inventors: Juri Krieger, Brookline, MA (US); Stuart Spitzer, Lynnfield, MA (US)

(73) Assignee: Spansion LLC, Sunnyvale, CA (US)

( * ) Notice: Subject to any disclaimer, the term of this patent is extended or adjusted under 35 U.S.C. 154(b) by 138 days.

(21) Appl. No.: 11/052,689

(22) Filed: Feb. 7, 2005

(65) Prior Publication Data

US 2006/0175598 A1    Aug. 10, 2006

(51) Int. Cl.
    *G11C 11/00*    (2006.01)
(52) U.S. Cl. .......................................... 365/148; 257/40
(58) Field of Classification Search ................. 365/148; 257/40, 296
    See application file for complete search history.

(56) References Cited

U.S. PATENT DOCUMENTS

| | | | |
|---|---|---|---|
| 6,768,157 B1 | 7/2004 | Krieger et al. | 257/314 |
| 6,806,526 B1 | 10/2004 | Krieger et al. | 257/296 |
| 6,977,389 B1* | 12/2005 | Tripsas et al. | 257/40 |
| 2005/0227382 A1* | 10/2005 | Hui | 438/14 |
| 2006/0067105 A1* | 3/2006 | Fang et al. | 365/148 |

* cited by examiner

*Primary Examiner*—Vu A. Le

(57) ABSTRACT

The present memory device includes a first electrode, a passive layer on and in contact with the first electrode, the passive layer including copper sulfide, a barrier layer on and in contact with the passive layer, an active layer on and in contact with the barrier layer, and a second electrode on and in contact with the active layer. The inclusion of the barrier layer in this environment increases switching speed of the memory device, while also improving data retention thereof.

9 Claims, 2 Drawing Sheets

MEMORY DEVICE INCLUDING BARRIER LAYER FOR IMPROVED SWITCHING SPEED AND DATA RETENTION

BACKGROUND OF THE INVENTION

1. Technical Field

This invention relates generally to memory devices, and more particularly, to a memory device with improved switching speed and data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state, also referred to as "0" and "1". Typically, a memory device is addressed to retrieve a specified number of byte(s) (e.g. 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30 which includes advantageous characteristics for meeting these needs. The memory device 30 includes a Cu electrode 32, a copper sulfide passive layer 34 on the electrode 32, an active layer 36 such as $Cu_2O$ or various polymers on the layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the "programming" electrical potential) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. This potential $V_{er}$ is sufficient to cause copper ions to be repelled from the active layer 36 toward the electrode 32 and into the superionic layer 34, in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

Upon application of the electrical potential $V_{pg}$ to switch the memory device 32 from an erased state to a low-resistance or conductive state (low-resistance state indicated by the on-resistance line B), the current vs. voltage path A in this environment includes two identifiable connected portions, a first, or initial (in time) portion $A_1$ and a second, or later (in time) portion $A_2$. Typically, upon the programming voltage $V_{pg}$ being applied to the memory device 30, an initial rapid movement of ions into the active layer 34 takes place ($A_1$), followed by a slower transfer of ions thereinto ($A_2$). Thus, it has been found that the first portion $A_1$ of the switching operation takes place relatively rapidly (i.e., consumes relatively little time), while on the other hand, the second portion $A_2$ of the switching operation takes place relatively slowly (i.e., consumes appreciably more time). It will be understood that high switching speed is desirable, and that this second, slower portion slows down the pace of the switching operation, i.e., causes the overall switching operation to take more time than is desirable.

Therefore, what is needed is an approach which decreases switching operation time in the present environment.

DISCLOSURE OF THE INVENTION

Broadly stated, the present invention is a memory device comprising a first electrode, a passive layer on and in contact with the first electrode, the passive layer comprising copper sulfide, a barrier layer on and in contact with the passive layer, an active layer on and in contact with the barrier layer, and a second electrode on and in contact with the active layer.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 3:
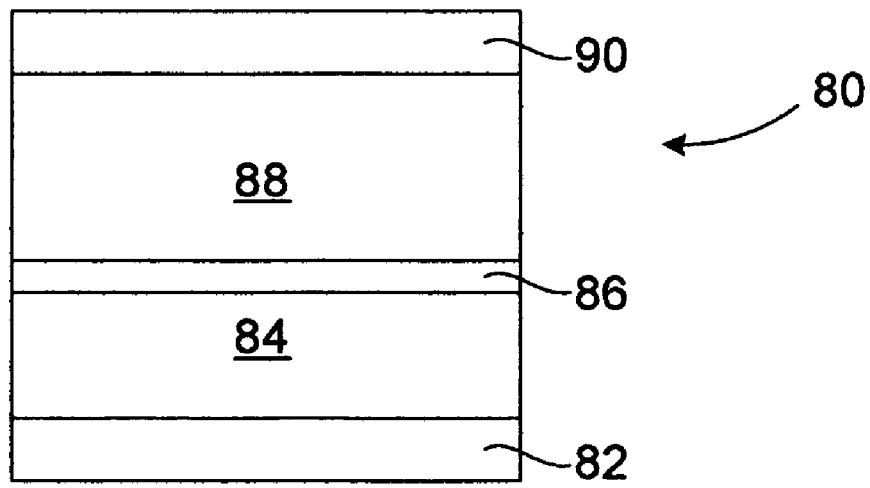
FIG. 3 is a cross-sectional view of the present memory device.

FIG. 3 illustrates an embodiment of memory device 80 of the present invention. The memory device 80 includes a Cu electrode 82, a copper sulfide passive layer 84 on, over and in contact with the electrode 82, a barrier layer 86 (which may for example be $CuO_x$, $WO_x$, $NiO_x$, or $TiO_x$, formed by for example deposition or oxidation) on, over and in contact with the copper sulfide layer 84, an active layer 88 (which may for example be an inorganic layer such as $Cu_2O$ or various organic polymers) on, over and in contact with the barrier layer 86, and a Ti electrode 90 on, over and in contact with the active layer 88.

Figure 1:
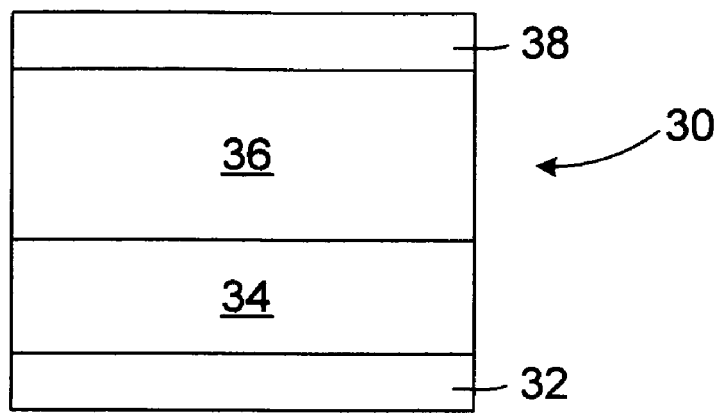
FIG. 1 is a cross-sectional view of a typical memory device.
Figure 2:
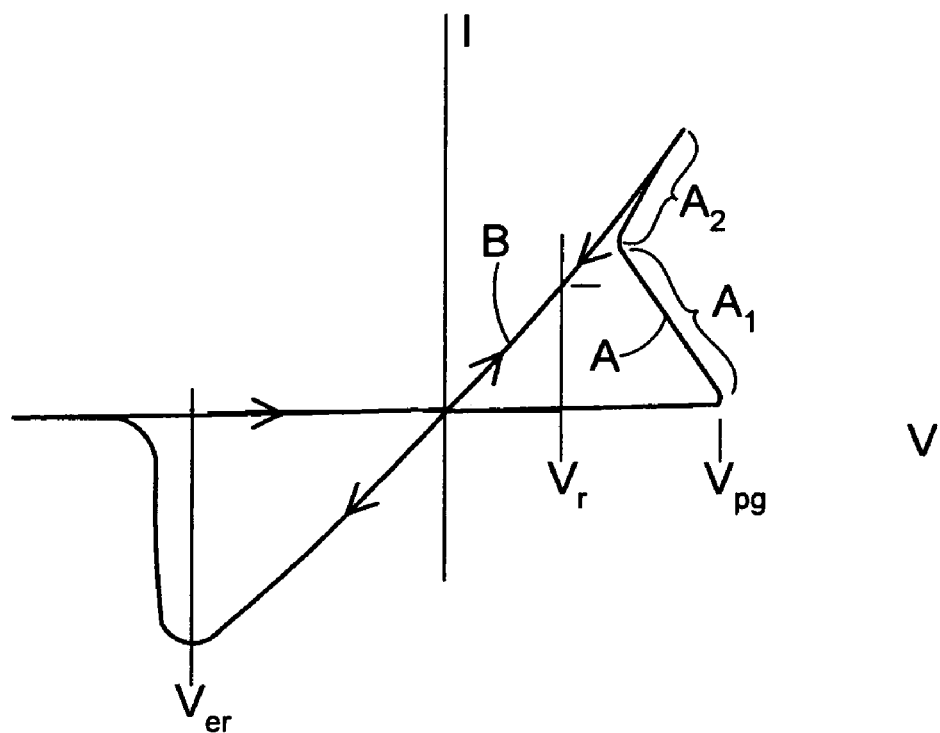
FIG. 2 is a plot of current vs. voltage in the programming, reading and erasing of the memory device of FIG. 1.
Figure 4:
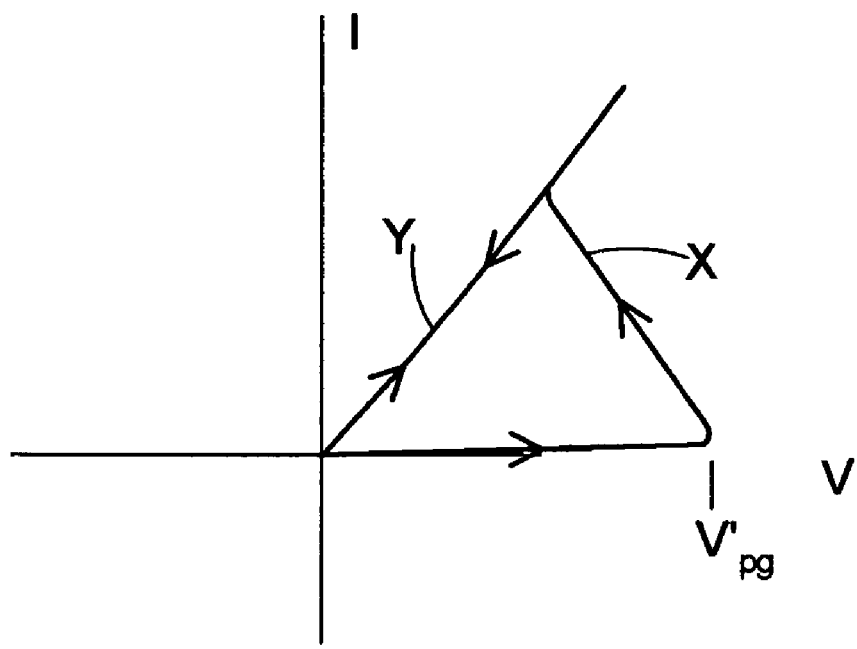
FIG. 4 is a plot of current vs. voltage in the programming of the memory device of FIG. 3.

Initially, assuming that the memory device 80 is unprogrammed, in order to program the memory device 80, an increasingly negative voltage is applied to the electrode 90, while the electrode 82 is held at ground, so that an increasing electrical potential is applied across the memory device 80 from a higher to a lower potential in the direction from electrode 82 to electrode 90. During this buildup of electrical potential, the barrier layer 86 blocks ions from flowing into the active layer 88 as previously described, until a critical electric field level $V'_{pg}$ ($V'_{pg} > V_{pg}$ of FIG. 2) is reached. When this critical electric field level is reached, rapid ion injection takes place from the copper sulfide layer 84 through the barrier layer 86 and into the active layer 88, causing the active layer 36 (and the overall memory device 80) to rapidly switch to a low-resistance or conductive state (X, FIG. 4). Upon removal of such potential, the copper ions drawn into the active layer 88 during the programming step remain and self-diffuse therein, so that the active layer 86 (and memory device 80) remain in a conductive or low-resistance state, as indicated by the resistance characteristic (Y).

It will be seen that with the inclusion of the barrier layer 86, the overall switching speed is greatly improved. In addition, the inclusion of the barrier layer 86 provides improved data retention. In the case of a programmed memory device 80, with no electrical potential applied thereto, the charged ions have a tendency to return to their initial state or location under the influence of internal electrical fields. As such, the charged ions in the active layer 88 would tend to move from the active layer 88 into the copper sulfide layer 84. The barrier layer 86 impedes such motion, increasing the stability of the programmed state of the memory device 80.

The barrier layer operating characteristics are determined by both its thickness and its electronic conductivity. These properties can be optimized in a particular setting for fast switching and long data retention.

The read and erase steps are undertaken on the memory device 80 as previously described.

It will be seen that herein is provided a memory device with improved switching speed and data retention. This is achieved by including a barrier layer between the passive and active layers of the device.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
    a first electrode;
    a passive layer on and in contact with the first electrode, the passive layer comprising copper sulfide;
    a barrier layer on and in contact with the passive layer;
    an active layer on and in contact with the barrier layer; and
    a second electrode on and in contact with the active layer;
    wherein the barrier layer comprises at least one material selected from the group consisting of $CuO_x$, $WO_x$, $NiO_x$, and $TiO_x$.

2. The memory device of claim 1 wherein the first electrode comprises copper.

3. The memory device of claim 1 wherein the active layer is an organic layer.

4. The memory device of claim 1 wherein the active layer is an inorganic layer.

5. A memory device comprising:
    a first electrode;
    a passive layer on and in contact with the first electrode;
    a barrier layer on and in contact with the passive layer, wherein the barrier layer comprises at least one material selected from the group consisting of $CuO_x$, $WO_x$, $NiO_x$, and $TiO_x$;
    an active layer on and in contact with the barrier layer; and
    a second electrode on and in contact with the active layer.

6. The memory device of claim 5 wherein the passive layer is copper sulfide.

7. The memory device of claim 6 wherein the first electrode is copper.

8. The memory device of claim 7 wherein the active layer is an organic layer.

9. The memory device of claim 7 wherein the active layer is an inorganic layer.

* * * * *